United States Patent [19]

Matsuura

[11] Patent Number: 4,967,110

[45] Date of Patent: Oct. 30, 1990

[54] MASTER-SLICE TYPE INTEGRATED CIRCUIT INCLUDING MACROCELLS ASSOCIATED WITH DELAY CIRCUIT

[75] Inventor: Hideki Matsuura, Tokyo, Japan

[73] Assignee: NEC Corporation, Tokyo, Japan

[21] Appl. No.: 316,284

[22] Filed: Feb. 27, 1989

[30] Foreign Application Priority Data

Feb. 26, 1988 [JP] Japan .................................. 63-45001

[51] Int. Cl.⁵ ........................ H03K 5/13; H03K 17/16
[52] U.S. Cl. .................................... 307/592; 307/443; 307/262; 307/602; 307/465; 328/55
[58] Field of Search ............... 307/443, 592, 262, 602, 307/465; 328/55

[56] References Cited

U.S. PATENT DOCUMENTS 4,626,716 12/1986 Miki .................................. 307/602

Primary Examiner—Stanley D. Miller
Assistant Examiner—Margaret Rose Wambach
Attorney, Agent, or Firm—Helfgott & Karas

[57] ABSTRACT

A master slice type integrated circuit includes at least one macrocell having a predetermined function, a delay circuit connected to an output of the macrocell and capable of giving a plurality of different delay times, and an output buffer having an input connected to an output of the delay circuit. The delay circuit is previously set to one selected from the plurality of delay times so as to realizing a dely time required for an output of the output buffer.

5 Claims, 3 Drawing Sheets

MASTER-SLICE TYPE INTEGRATED CIRCUIT INCLUDING MACROCELLS ASSOCIATED WITH DELAY CIRCUIT

BACKGROUND OF THE INVENTION

1. Field of the Invention

The present invention relates to a master slice type integrated circuit, and more specifically to such a master slice type integrated circuit of the gate array structure including a plurality of output buffers.

2. Description of Related Art

In the prior art, the master slice type integrated circuits have included for example a unitary circuit as shown in FIG. 1. In the shown circuit, an input signal Vi is supplied through an input buffer 10 to an internal macrocell (or macrogate) 12. In this specification, the term "macrocell" is used to mean one definite or consolidated function unit, which can be formed of one or more basic logic units or cells such as NOT, AND, OR, NAND, NOR etc, or a combination of basic logic cells. In the shown example, macrocell 12 is composed of an inverter 12A connected at its input to an output of the input buffer 10 and a two-input NAND gate 12B having a first input connected to an output of the inverter 12A and a second input connected to receive a suitable signal (not shown) so that a given processing can be performed. An output of the macrocell 12 (for example an output of the NAND gate 12B) is directly connected to an output buffer 14, which simply functions to supply the output of the macrocell 12 as an output signal Vo to an external after a delay time inherent to the output buffer 14.

In the master slice type integrated circuits, however, it is in some cases desired to cause a number of unitary circuits (macrocells) to have the same delay time between an input terminal and an output terminal. In other cases, it is required to shift the timing of the output signal of adjacent unitary circuits from each other.

On the other hand, the conventional master slice type integrated circuits have been designed by use of a CAD (computer aided design) tool, so that locations of respective macrocells as well as wiring between macrocells are automatically designed. As a result, the delay time of each unitary circuit (macrocell) has been fixed and therefore a desired delay time could not necessarily have been obtained.

Therefore, in order to cause some number of selected unitary circuits (macrocells) to have the same delay time between an input terminal and an output terminal, it is necessary for a person to perform a manual additional design modification for changing the locations and the wirings of all macrocells which are required to have the same delay time.

Furthermore, if a plurality of output buffers located adjacent to one another change their output signals at substantially the same timing, a power supply voltage and a ground potential are influenced by charge and discharge currents at output terminals of those output buffers, with the result that there would be a concern for malfunction of circuits. To prevent the malfunction, it is preferred to shift the output signal timings of adjacent output buffers little by little. For this purpose, however, the conventional master slice type integrated circuits also are required to manually add a number of gates before the output buffers or to change the internal wiring of the integrated circuit since the output buffers themselves have no function for controlling the delay time.

As mentioned above, the conventional master slice type integrated circuits have been such that an output of each internal macrocell is directly connected to an associated output buffer, and therefore, each unitary circuit composed of the macrocell has a fixed signal delay time between an input terminal and an output terminal. As a result, if it is necessary to adjust the delay time between an input terminal and an output terminal, a manual modification has been required at a stage of design for changing the locations and the wirings of the macrocells concerned and for adding a required number of gates. Accordingly, the design time for the integrated circuit design will be inevitably increased. In addition, since it was not possible to adjust the delay time and to compensate the dispersion of property caused by a manufacturing process, applications of finished products have been limited.

SUMMARY OF THE INVENTION

Accordingly, it is an object of the present invention to provide a master slice type integrated circuit which has overcome the above mentioned defect of the conventional one.

Another object of the present invention is to provide a master slice type integrated circuit capable of easily adjusting and controlling the delay time thereby to decrease a required time for design and to enlarge the extent of application.

The above and other objects of the present invention are achieved in accordance with the present invention by a master slice type integrated circuit including at least one macrocell having a predetermined function, a delay circuit connected to an output of the macrocell and capable of selectively giving a plurality of different delay times, and an output buffer having an input connected to an output of the delay circuit. The delay circuit is previously set to provide one selected from the plurality of delay times so as to realize a delay time required for an output of the output buffer.

Preferably, the delay circuit is composed of a plurality of unitary delay circuits located in parallel to one another and having different delay times, one unitary delay circuit being selected from the plurality of unitary delay circuits so that the selected unitary delay circuit is connected at its input to the output of the macrocell and at its output to the input of the output buffer.

Accordingly to another aspect of the present invention, a master slice type integrated circuit is provided including at least one macrocell having a predetermined function, a delay circuit connected to an output of the macrocell and capable of providing a plurality of different delay outputs, a multiplexor receiving the plurality of different delay outputs of the delay circuit, and an output buffer having an input connected to an output of the multiplexor. The multiplexor is controlled by a control signal so as to output one selected from the plurality of delay outputs and to realize a delay time required for an output of the output buffer.

The above and other objects, features and advantages of the present invention will be apparent from the following description of preferred embodiments of the invention with reference to the accompanying drawings.

DESCRIPTION OF THE PREFERRED EMBODIMENTS

Figure 1:
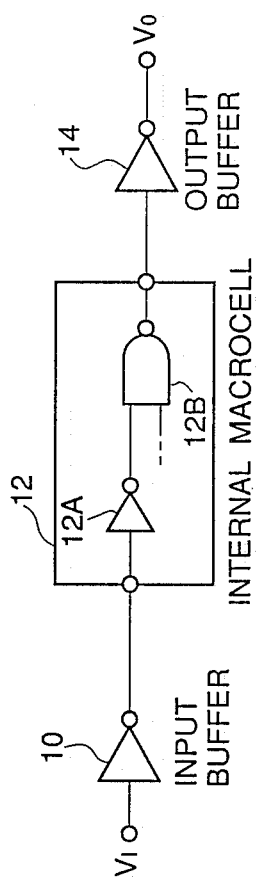
FIG. 1 is a logic circuit diagram of one example of a unitary circuit of the conventional master slice type integrated circuit.
Figure 2:
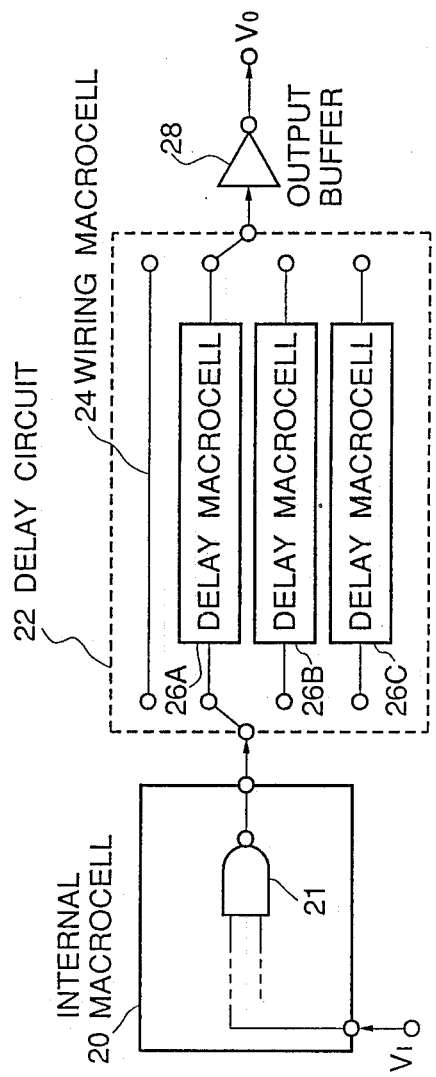
FIG. 2 is a logic circuit diagram of one embodiment of a unitary circuit of the master slice type integrated circuit in accordance with the present invention.

Referring to FIG. 2, there is shown a logic circuit diagram of one embodiment of a unitary circuit of the master slice type integrated circuit in accordance with the present invention. The shown circuit comprises a macrocell 20 having a predetermined function and receiving an input signal Vi. The internal macrocell 20 includes a two-input NAND gate 21 which is composed of internal basic cells (not shown). An output of the internal macrocell is connected to a delay circuit 22 which includes a wiring conductor 24 giving no substantial delay or only a minute delay, and three macrocells 26A, 26B and 26C each having different delay times. Wiring conductor 24 will be referred to as a "wiring macrocell" in this specification. Specifically, an output of the internal macrocell is connected to at least one selected from the group consisting of the wiring macrocell 24 and the three delay macrocells 26A, 26B and 26C, namely in the shown embodiment, to the delay macrocell 26A. An output of the delay circuit 22, namely, an output of the selected delay macrocell 26A is connected to an output buffer 28, which generates an output signal Vo.

The wiring macrocell 24 can be composed of only a wiring conductor having a necessary and sufficient length for connecting the output of the macrocell to the input of the output buffer so that no substantial delay will occur. However, the wiring macrocell 24 can be composed of a wiring conductor having a regulated length longer than the necessary and sufficient length for connecting the output of the macrocell to the input of the output buffer, so that a predetermined minute but meaningful delay is given by the wiring macrocell. On the other hand, for example, each of the delay macrocells is composed of one or more internal basic cells or gate stages or for gate loads (not shown).

With this arrangement, an output signal from the internal macrocell 20 is delayed by a predetermined delay amount or time given by the delay circuit 22, namely, the selected delay macrocell 26A. Thereafter, the delayed signal is supplied to the output buffer 28. Therefore, by selecting one from the group consisting of the wiring macrocell 24 and the three delay macrocells 26A, 26B and 26C, and then, by connecting the selected one between the internal macrocell 20 and the output buffer 28 for examply by selecting a wiring mask pattern, it is possible to easily adjust or compensate the delay time of a signal inputted to the output buffer 28.

The following explains the design processing to cause one pair of selected logic paths within a master slice type integrated circuit (the selected logic paths being composed of a unitary circuit as shown in FIG. 2) to have substantially the same delay time between the input signal Vi and the output signal Vo.

First, the overall element location and wiring of a master slice type integrated circuit are automatically designed by use of a CAD tool under the assumption that the output of the internal macro 20 is connected to the input of the output buffer 28 through the wiring macrocell 24.

Then, the delay time of each logic path in the integrated circuit is calculated on the basis of the result of the automatically designed wiring pattern, and then, a difference in delay time between the pair of selected logic paths which are desired to make the respective delay times consistent to each other is calculated.

Thereafter, among the delay macrocells 26A, 26B and 26C, one delay macrocell is selected which has a delay time nearest to the calculated delay time difference, and in one of the pairs of selected logic paths which has the delay time shorter than that of the other logic path, the selected macrocell is connected between the output of the internal macrocell and the input of the output buffer in place of the wiring macrocell.

Incidentally, the delay macrocells can be used alone or in combination.

On the other hand, if an output of the output buffer is not required to compensate the delay time, the internal macrocell is connected to the output buffer through the wiring macrocell. In this case, the performance inherent to the output buffer is not substantially influenced.

Figure 3:
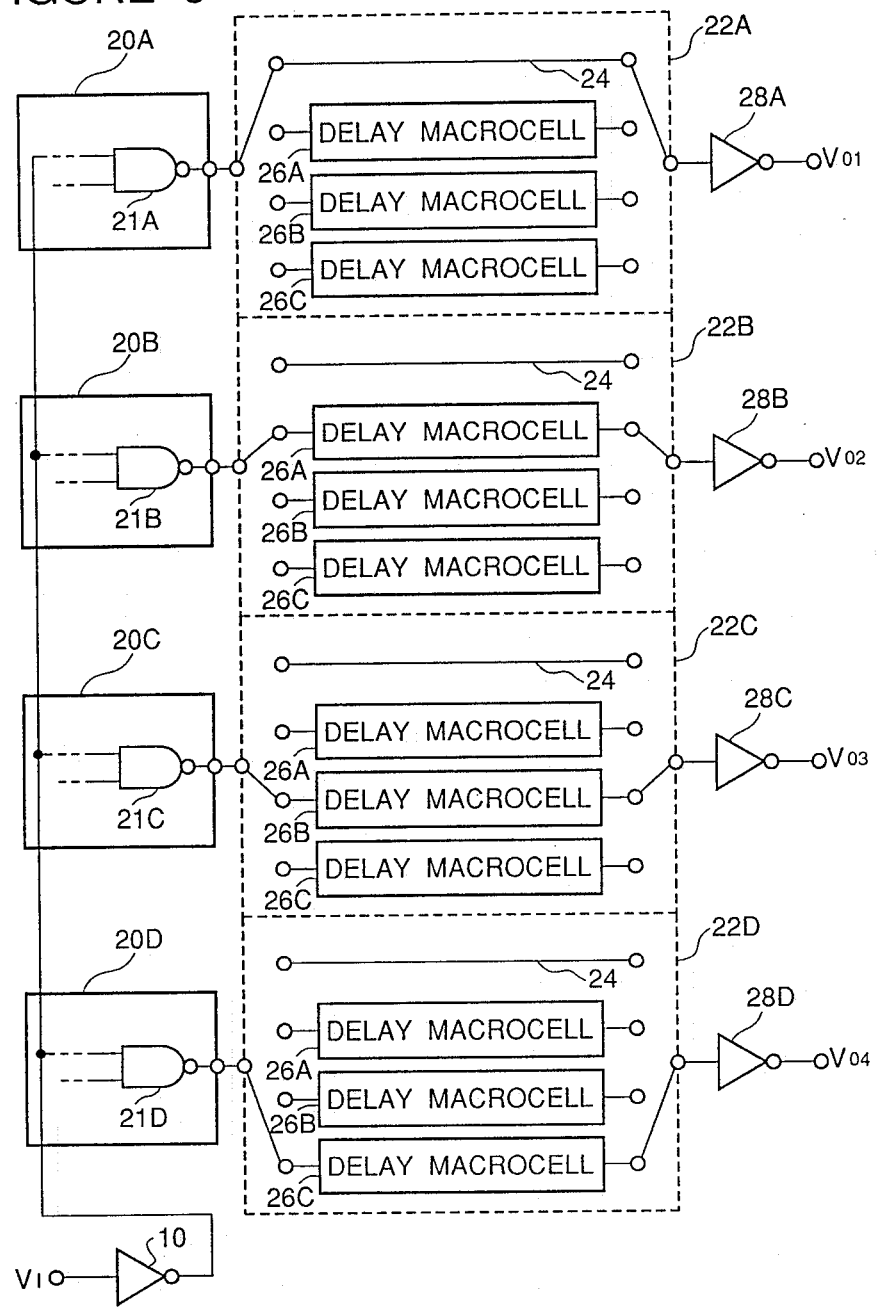
FIG. 3 is a logic circuit diagram of an applied example which uses the unitary circuit shown in FIG. 3.

Referring to FIG. 3, there is shown one example of an application of the unitary circuit shown in FIG. 2. The shown example includes four unitary circuits which are arranged in parallel to one another and each of which is the same as that shown in FIG. 2. In FIG. 3, therefore, circuit elements similar to those shown in FIG. 2 are given the same reference numerals, and the circuit elements having the same function are distinguished from one another by adding different alphabets to the same reference numerals.

In the shown application example, the input buffer 10 receives an input signal Vi at its input, and an output of the input buffer 10 is applied to four macrocells 20A, 20B, 20C and 20D in parallel, whose outputs are respectively supplied through four delay circuits 22A, 22B, 22C and 22D to four output buffers 28A, 28B, 28C and 28D located adjacent to one another in the same master slice type integrated circuit. In order to prevent a so-called electric source noise caused by a simultaneous operation of the four output buffers 28A, 28B, 28C and 28D, the respective timings of the output signals $V_{o1}$, $V_{o2}$, $V_{o3}$ and $V_{o4}$ of the four output buffers 28A, 28B, 28C and 28D are shifted little by little by action of the delay circuits 22A, 22B, 22C and 22D. For this purpose, the output of the macrocell 20A is connected through the wiring macrocell 24 to the output buffer 28A, and the output of the macrocell 20B is connected through the delay macrocell 26A to the output buffer 28B. Furthermore, the output of the macrocell 20C is connected through the delay macrocell 26B to the output buffer 28C, and the output of the macrocell 20D is connected through the delay macrocell 26C to the output buffer 28D.

If the output signals $V_{o1}$, $V_{o2}$, $V_{o3}$ and $V_{o4}$ of the four output buffers 28A, 28B, 28C and 28D are generated at different timings shifted from one another little by little, a peak value of the electric source current is correspondingly decreased, and therefore, it is possible to avoid malfunction of other circuits in the same master slice type integrated circuit.

Figure 4:
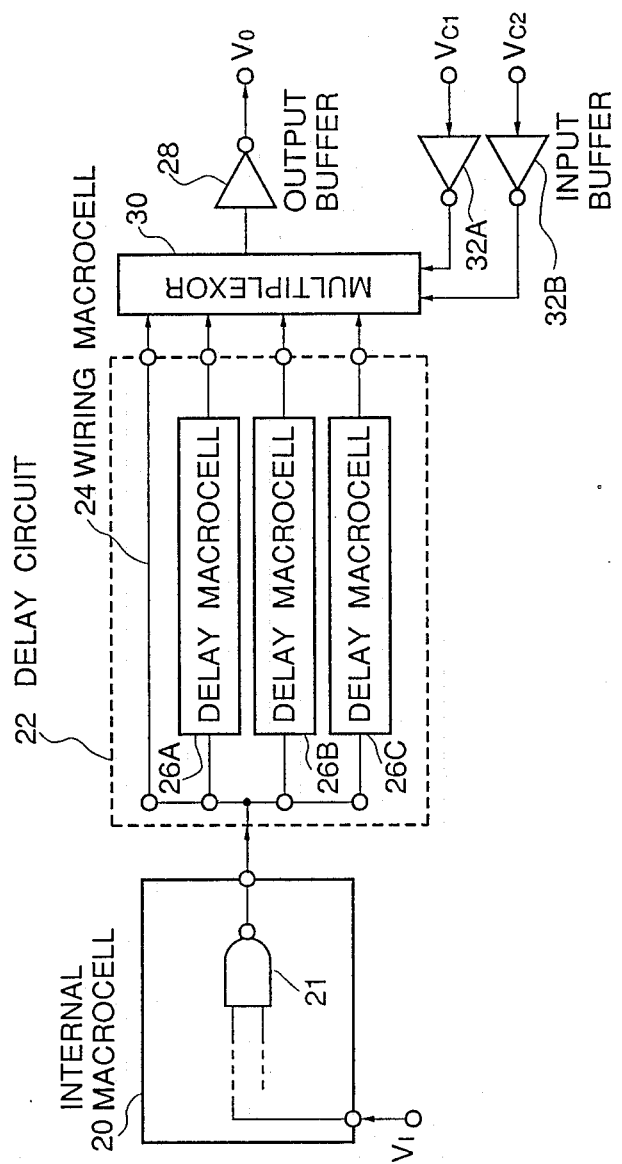
FIG. 4 is a logic circuit diagram of another embodiment of a unitary circuit of the master slice type integrated circuit in accordance with the present invention.

Turning to FIG. 4, there is shown a logic circuit diagram of another embodiment of the unitary circuit of the master slice type integrated circuit in accordance with the present invention. In FIG. 4, circuit elements similar to those shown in FIG. 2 are given the same reference numerals, and explanation thereof will be omitted.

As seen from comparison between FIGS. 2 and 4, the second embodiment is featured in that the output of the macrocell 20 is connected to the wiring macrocell 24 and all the delay macrocells 26A, 26B and 26C, whose outputs are connected to four inputs of a multiplexor 30, respectively. An output of the multiplexor 30 is connected to the output buffer 28, and is controlled by a pair of control signals $Vc_1$ and $Vc_2$, which are supplied through a pair of input buffers 32A and 32B to the multiplexor 30.

With the above arrangement, the multiplexor 30 is controlled by the control signals $Vc_1$ and $Vc_2$ to select one of the four output signals outputted from the wiring macrocell 24 and the delay macrocells 26A, 26B and 26C, respectively. Therefore, even in finished products, the delay amount can be adjusted or modified or controlled by use of the control signals $Vc_1$ and $Vc_2$.

As seen from the above explanation, the master slice type integrated circuit in accordance with present invention is characterized by the provision of a delay circuit between an internal macrocell and an output buffer, the delay circuit including a plurality of delay macrocells so that one of the delay macrocells can be selected and connected between an output of the internal macrocell and an input of the output buffer. Therefore, since the delay amount or time can be freely selected, the time for the integrated circuit design is remarkably decreased. Furthermore, the delay times of a plurality of paths can be made consistent with each other, or on the contrary, the output timings of a plurality of output buffers can be shifted from one another little by little for the purpose of preventing the electric source noise caused by a simultaneous operation of a plurality of output buffers. These delay time adjustment can be easily performed by selecting an active delay macrocell within the delay circuit, which can be easily carried out by, for example, selection of a mask pattern for wiring. Therefore, the extent of application of the master slice type integrated circuits can be enlarged.

In addition, with provision of the multiplexor which enables one to select a desired delay time or amount from external, the delay time can be adjusted, modified or controlled even in the finished products. Therefore, the extent of application of the master slice type integrated circuits can be further enlarged.

The invention has thus been shown and described with reference to the specific embodiments. However, it should be noted that the present invention is in no way limited to the details of the illustrated structures but changes and modifications may be made within the scope of the appended claims.

I claim:

1. A master slice type integrated circuit including a macrocell connected to an input terminal so as to receive an input signal through said input terminal and execute a predetermined processing for the received input signal, a delay circuit connected to an output of the macrocell and composed of a plurality of unitary delay circuits located in parallel to one another and having predetermined but different delay times, one of said unitary delay circuits being composed of a simple wiring which will cause no substantial delay time, one of said unitary delay circuits being selected to be connected to the output of said macrocell, an output buffer having an input connected to an output of said selected unitary delay circuit and an output connected to an output terminal, so that the output of the macrocell is outputted through said output buffer with a desired delay time between said input terminal and said output terminal, said unitary delay circuits being other than the selected unitary delay circuit and are connected to neither the output of the corresponding macrocell nor the input of the corresponding output buffer.

2. A master slice type integrated circuit including a plurality of input terminals, a corresponding number of unitary circuits each having an input connected to a corresponding one of the plurality of input terminals and a corresponding number of output terminals each connected to an output of a corresponding one of the unitary circuits, each of the unitary circuits being composed of one macrocell connected to the corresponding input terminal so as to receive an input signal through the corresponding input terminal and executing a predetermined processing for the received input signal, a delay circuit connected to an output of the macrocell and composed of a plurality of unitary delay circuits located in parallel to one another and having predetermined but different delay times, one of said unitary delay circuits being composed of a simple wiring which will cause no substantial delay time, one of said unitary delay circuits being selected to be connected to the output of said macrocell, an output buffer having an input connected to an output of the selected unitary delay circuit and an output connected to the corresponding output terminal, so that the output of the macrocell of each unitary circuit is outputted through the corresponding output buffer with a desired delay time between the corresponding input terminal and the corresponding output terminal, said unitary delay circuits being other than the selected unitary delay circuit being connected to neither the corresponding macrocell nor the corresponding output buffer.

3. A master slice type integrated circuit claimed in claim 2 wherein in each of the unitary circuits, the selected unitary delay circuit actually connected between the output of the corresponding macrocell and the input of the corresponding output buffer has a delay time minimizing a difference in an input terminal/output terminal delay time between the unitary circuits.

4. A master slice type integrated circuit claimed in claim 2 wherein in each of the unitary circuits, the selected unitary delay circuit actually connected between the output of the corresponding macrocell and the input of the corresponding output buffer has a delay time such that the input terminal/output terminal delay time of each of the unitary circuits gradually differs from one another.

5. A master slice type integrated circuit including at least one macrocell connected to an input terminal so as to receive an input signal through the input terminal and executing a predetermined processing for the received input signal, a delay circuit connected to an output of the macrocell and composed of a plurality of unitary delay circuits located in parallel to one another and having predetermined but different delay times, one of the unitary delay circuits being composed of a simple wiring which will cause no substantial delay time, all of the unitary delay circuits being connected to the output of the macrocell, a multiplexor receiving outputs of all said plurality of unitary delay circuits and an output buffer having an input connected to an output of the multiplexor and an output connected to an output terminal, the multiplexor being controlled by a control signal so as to output one selected from the output of said plurality of unitary delay circuits to the output buffer, so that the output of the macrocell is outputted through the output buffer with a desired delay time between the input terminal and the output terminal.

* * * * *